US009112317B2

(12) United States Patent
Mason et al.

(10) Patent No.: US 9,112,317 B2
(45) Date of Patent: Aug. 18, 2015

(54) INTERCONNECT DEVICE

(75) Inventors: Jeffery Walter Mason, North Attleboro, MA (US); Wayne Stewart Alden, III, Whitman, MA (US); William Brian Murphy, Brockton, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 118 days.

(21) Appl. No.: 13/493,778

(22) Filed: Jun. 11, 2012

(65) Prior Publication Data
US 2013/0330960 A1    Dec. 12, 2013

(51) Int. Cl.
*H01R 12/00* (2006.01)
*H01R 12/71* (2011.01)
*H05K 7/10* (2006.01)

(52) U.S. Cl.
CPC .......... *H01R 12/714* (2013.01); *H05K 7/1069* (2013.01)

(58) Field of Classification Search
CPC ........................ H01R 23/722; H01R 7/1061
USPC ..................................... 439/70, 71
See application file for complete search history.

(56) References Cited

U.S. PATENT DOCUMENTS

| 5,221,209 | A  | * | 6/1993  | D'Amico ................ 439/71 |
| 5,653,600 | A  | * | 8/1997  | Ollivier ................ 439/73 |
| 6,164,980 | A  |   | 12/2000 | Gooddwin |
| 6,644,981 | B2 | * | 11/2003 | Choy ................ 439/70 |
| 6,796,805 | B2 |   | 9/2004  | Murr |
| 6,877,993 | B2 | * | 4/2005  | Palaniappa et al. ........ 439/73 |
| 7,077,664 | B1 | * | 7/2006  | Wang et al. ........ 439/70 |
| 7,086,902 | B1 | * | 8/2006  | Yang ........ 439/607.36 |
| 7,147,481 | B2 | * | 12/2006 | Yang ........ 439/71 |
| 7,309,238 | B2 | * | 12/2007 | Yang ........ 439/71 |
| 7,435,103 | B2 | * | 10/2008 | Ma ........ 439/71 |
| 7,594,818 | B1 | * | 9/2009  | Asai ........ 439/71 |
| 2009/0124100 | A1 | * | 5/2009 | Mason et al. ........ 439/66 |

* cited by examiner

*Primary Examiner* — Phuong Dinh

(57) ABSTRACT

An interconnect device includes a contact assembly having a carrier holding an array of conductors. Each of the conductors have opposite first and second ends configured to engage corresponding first and second electrical components. The conductors define conductive paths between the first and second ends to electrically interconnect the first and second electrical components. The interconnect device includes a frame defining a receiving space configured to receive the first electrical component therein. The frame includes corner frames having metal spring fingers configured to engage different side edges of the first electrical component to locate the first electrical component in the receiving space. The spring fingers are deflectable and are configured to be spring biased against corresponding side edges of the first electrical component.

20 Claims, 4 Drawing Sheets

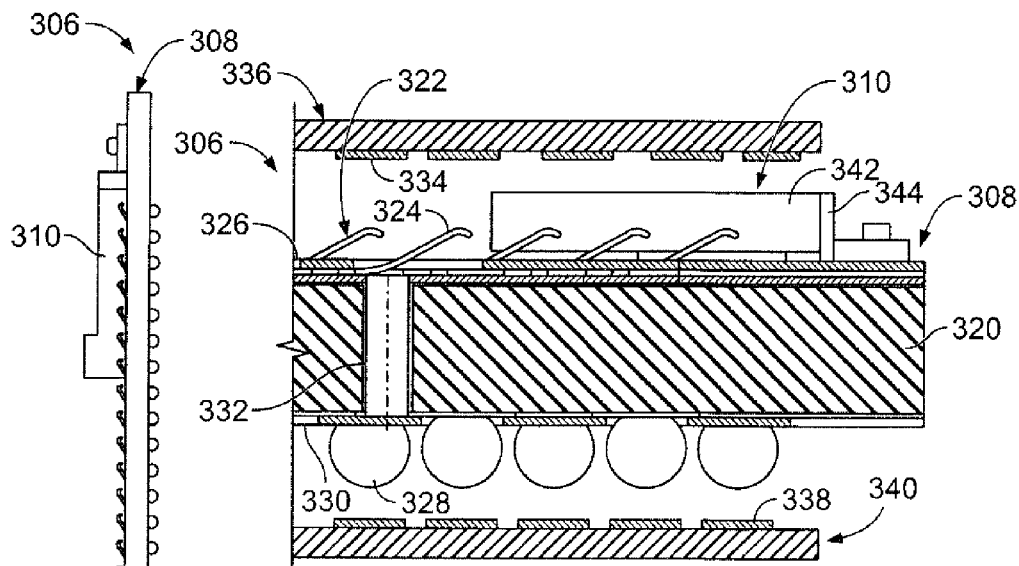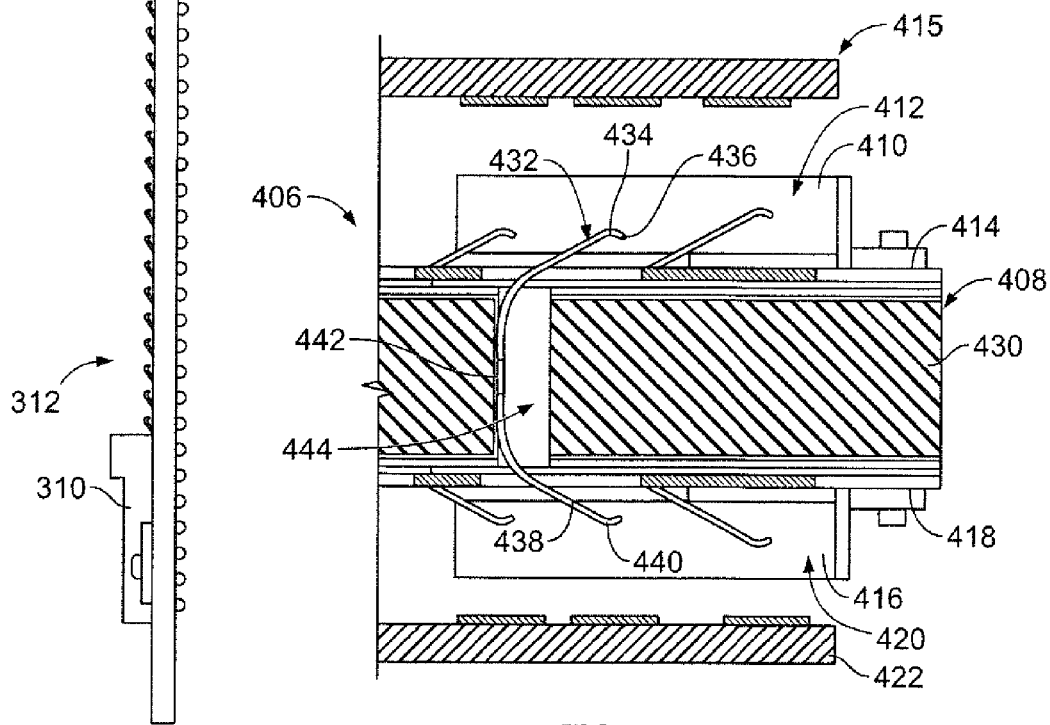

INTERCONNECT DEVICE

BACKGROUND OF THE INVENTION

The subject matter herein relates generally to interconnect devices for use between opposed arrays of contacts.

Interconnect devices are used to provide electrical connection between two or more opposing arrays of contacts for establishing at least one electrical circuit, where the respective arrays may be provided on a device, printed circuit board, Pin Grid Array (PGA), Land Grid Array (LGA), Ball Grid Array (BGA), and the like. In one interconnect technique, the electrical connection is provided by an interconnect device that is physically interposed between corresponding electrical contacts of the opposing arrays of contacts.

At least some known interconnect devices use a plastic frame that defines a socket that receives an electrical component or package having one of the arrays of contacts. The plastic frame has deflectable, plastic fingers that locate the package in the socket. Such plastic frames are not without disadvantages. For example, the plastic frames take up valuable space and increase the size of the interconnect devices. The plastic fingers are susceptible to damage and breaking. The plastic fingers have limited spring characteristics, which causes the package to be improperly located at times.

A need remains for an interconnect device that has improved package alignment.

BRIEF DESCRIPTION OF THE INVENTION

In one embodiment, an interconnect device is provided including a contact assembly having a carrier holding an array of conductors. Each of the conductors have opposite first and second ends configured to engage corresponding first and second electrical components. The conductors define conductive paths between the first and second ends to electrically interconnect the first and second electrical components. The interconnect device includes a frame defining a receiving space configured to receive the first electrical component therein. The frame includes corner frames having metal spring fingers configured to engage different side edges of the first electrical component to locate the first electrical component in the receiving space. The spring fingers are deflectable and are configured to be spring biased against corresponding side edges of the first electrical component.

In another embodiment, an interconnect device is provided including a contact assembly having an insulative carrier holding an array of conductive elastomeric columns. Each of the elastomeric columns have opposite first and second ends configured to engage corresponding first and second electrical components. The elastomeric columns are internally conductive between the first and second ends to electrically interconnect the first and second electrical components. The contact assembly includes a frame defining a receiving space configured to receive the first electrical component therein. The frame has corner frames having metal spring fingers configured to engage different side edges of the first electrical component to locate the first electrical component in the receiving space. The spring fingers are deflectable and are configured to be spring biased against corresponding side edges of the first electrical component.

BRIEF DESCRIPTION OF THE DRAWINGS

FIG. 7 is a side view of an interconnect device for the electrical interconnect system formed in accordance with an exemplar embodiment.

FIG. 8 is partial cross sectional view of an interconnect device showing a corner frame.

FIG. 9 is an exploded view of an interconnect device showing corner frames.

DETAILED DESCRIPTION OF THE INVENTION

Figure 1:
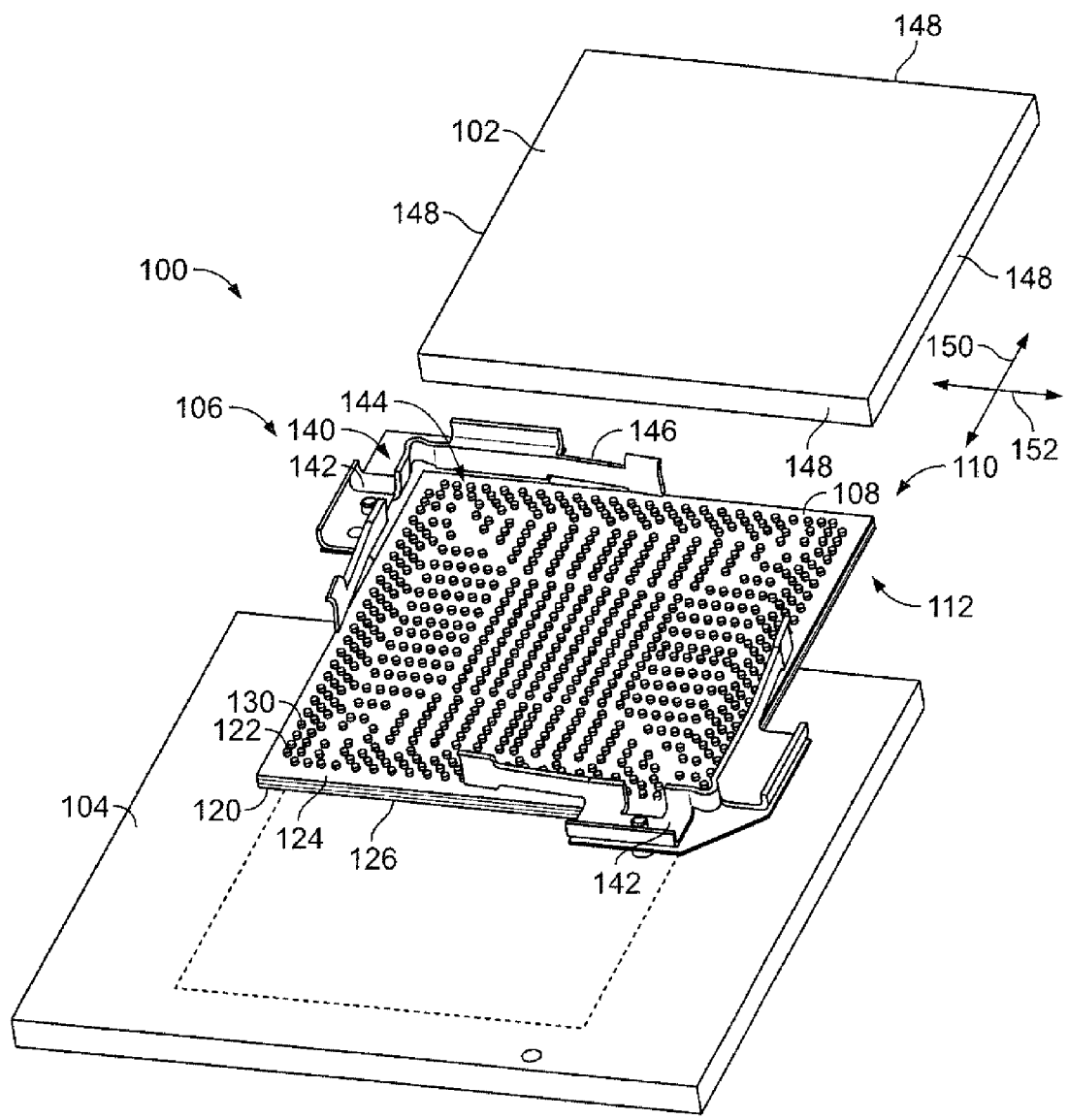
FIG. 1 illustrates an electrical interconnect system formed in accordance with an exemplary embodiment.

FIG. 1 illustrates an electrical interconnect system 100 formed in accordance with an exemplary embodiment. The system 100 includes a first electrical component 102, a second electrical component 104, and an interconnect device 106 therebetween. The interconnect device 106 is illustrated poised for mounting to the second electrical component 104. The first electrical component 102 is illustrated poised for mounting to the interconnect device 106. The first and second electrical components 102, 104 both have an array of contacts, such as land grid arrays, ball grid arrays and the like that are electrically connected together by the interconnect device 106.

In the illustrated embodiment, the first electrical component 102 is an electronic package, such as a chip, a processor, an integrated circuit and the like. The second electrical component 104 is a printed circuit board. In an exemplary embodiment, the interconnect device 106 constitutes a socket that is mounted to the printed circuit board and is configured to receive a chip. In alternative embodiments, other types of electrical components may be interconnected by the interconnect device 106. For example, both the first and second electrical components 102, 104 may be printed circuit boards.

The interconnect device 106 has a contact assembly 108 that is used to electrically connect the first and second electrical components 102, 104. For example, the contact assembly 108 is configured to engage the arrays of contacts of the first and second electrical components 102, 104. The contact assembly 108 has a first mating interface 110 and a second mating interface 112. The first mating interface 110 is configured to be electrically connected to the first electrical component 102. The second mating interface 112 is configured to be electrically connected to the second electrical component 104.

The contact assembly 108 includes an insulative carrier 120 holding an array of conductors 122. In the illustrated embodiment, the conductors 122 are elastomeric columns and may be referred to hereinafter as elastomeric columns 122. Other types of conductors may be used in alternative embodiments to define electrical paths through the contact assembly 108.

The insulative carrier 120 is fabricated from an insulative material, such as a polyimide material that may be arranged as a polyimide film, such as a Kapton® material. The insulative carrier 120 may have one or more layers. For example, the insulative carrier 120 may have coverlays and bonding layers on first and second sides 124, 126 of the carrier 120 that surround the elastomeric columns 122. The coverlays limit compression of the elastomeric columns 122.

The elastomeric columns 122 are arranged in an array having a predetermined pattern or layout that corresponds to the array of contacts of the first electrical component 102 and the second electrical component 104. The elastomeric columns 122 extend outward from both the first and second sides 124, 126. The elastomeric columns 122 extend between a first end 130 and a second end (not shown) opposite the first end 130. In an exemplary embodiment, the elastomeric columns 122 are frustoconically shaped, being wider about the mid-section and narrower at the ends 130. The elastomeric columns 122 are held at the mid-section by the insulative carrier 120. In an exemplary embodiment, the elastomeric columns 122 are conductive elastomeric columns, such as columns fabricated from a mixture of an elastic material and conductive flakes. The elastomeric columns 122 provide conductive, electrical paths between the ends 130. In an exemplary embodiment, the elastomeric columns 122 are metalized particle interconnects. The elastomeric columns 122 are at least partially compressible, such as when the first electrical component 102 is mounted to the contact assembly 108.

The interconnect device 106 includes a frame 140 having a plurality of corner frames 142. The corner frames 142 are separate from one another. The corner frames 142 define a receiving space 144 that receives the first electrical component 102. The corner frames 142 are configured to be mounted to the carrier 120, such as by using fasteners, latches and the like. The contact assembly 108 supports the corner frames 142. The corner frames 142 have metal spring fingers 146 that engage different side edges 148 of the first electrical component 102 to locate the first electrical component 102 in the receiving space 144. In the illustrated embodiment, first and second corner frames 142 are used that together engage all four side edges of the first electrical component 102, such as with one corner frame 142 engaging first and second side edges and the opposite corner frame 142 engaging third and fourth side edges. Some of the spring fingers 146 control lateral positioning of the first electrical component 102 along a lateral axis 150, while other spring fingers 146 control transverse positioning of the first electrical component 102 along a transverse axis 152. Any number of corner frames 142 may be used in alternative embodiments. The number of corner frames 142 may depend on the size and shape of the first electrical component 102.

Figure 2:
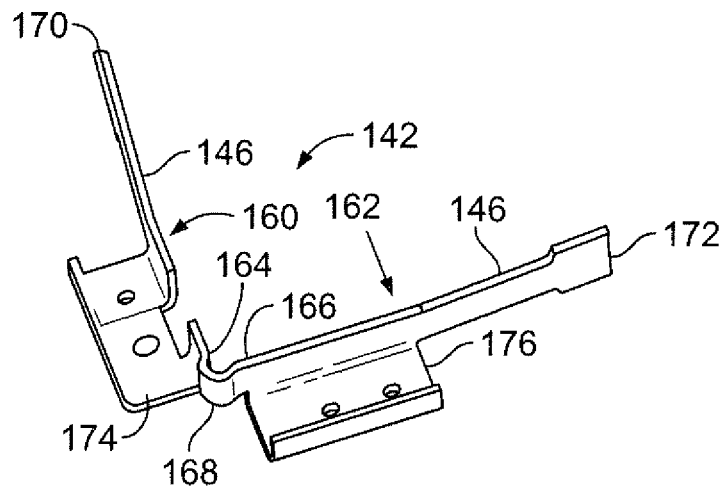
FIG. 2 is a top perspective view of a corner frame for the electrical interconnect system formed in accordance with an exemplar embodiment.
Figure 3:
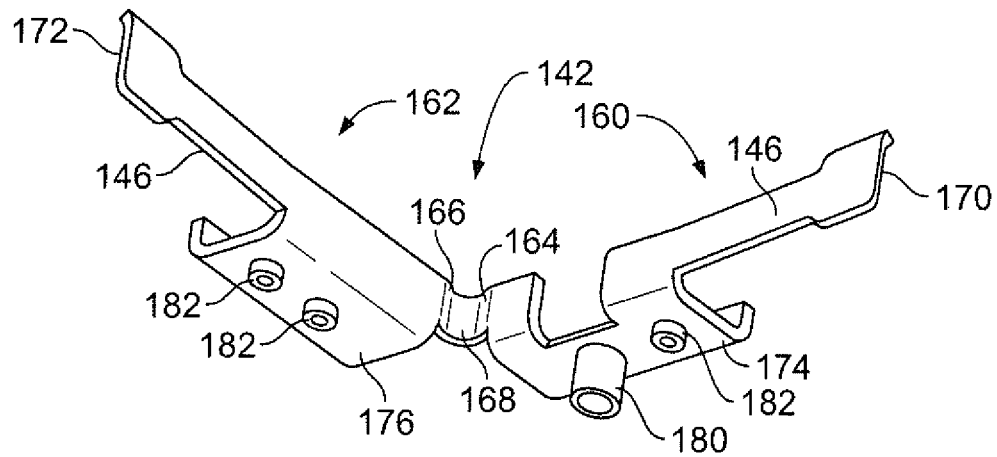
FIG. 3 is a bottom perspective view of the corner frame.
Figure 4:
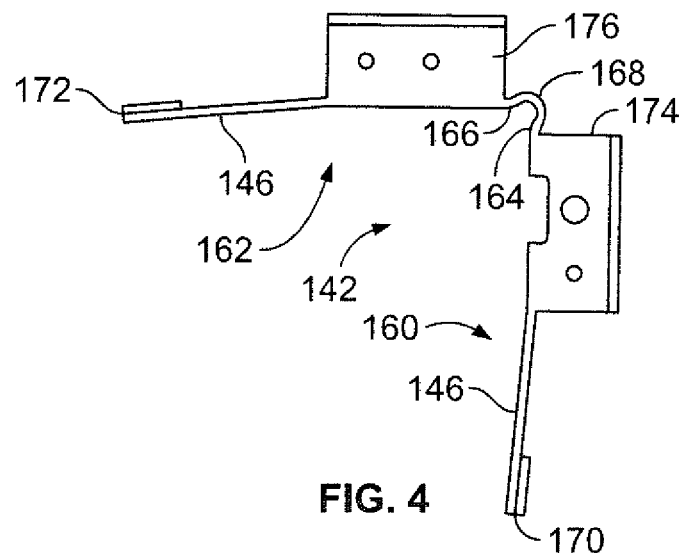
FIG. 4 is a top view of the corner frame.

FIG. 2 is a top perspective view of one of the corner frames 142 formed in accordance with an exemplary embodiment. FIG. 3 is a bottom perspective view of the corner frame 142. FIG. 4 is a top view of the corner frame 142. In an exemplary embodiment, the corner frame 142 is stamped and formed from a metal sheet to include features for mounting the corner frame 142 to the contact assembly 108 (shown in FIG. 1) and features for engaging and locating the first electrical component 102 (shown in FIG. 1).

The corner frame 142 includes a first arm 160 and a second arm 162. The arms 160, 162, are configured to engage different side edges 148 (shown in FIG. 1) of the first electrical component 102. In an exemplary embodiment, the first and second arms 160, 162 are joined at proximal ends 164, 166 thereof. For example, the first and second arms 160, 162 may be joined at a hinge 168 that allows the first and second arms 160, 162 to pivot relative to one another, such as to position the corner frame 142 on the contact assembly 108 and or to properly locate the first electrical component 102. The hinge 168 may spring bias the first and second arms 160, 162, such as by flexing when the corner frames 142 are mounted to the contact assembly 108.

Each arm 160, 162 include one of the spring fingers 146 at distal ends 170, 172 of the arms 160, 162. In an exemplary embodiment, each arm 160, 162 includes a base 174, 176, respectively. The bases 174, 176 are configured to be mounted to the contact assembly 108. The metal spring fingers 146 extend from the bases 174, 176. Optional, the bases 174, 176 may be oriented perpendicular with respect to the spring fingers 146. For example, the bases 174, 176 may be oriented generally horizontally while the spring fingers 146 may be oriented generally vertically.

In an exemplary embodiment, the first and second arms 160, 162 are oriented generally perpendicular with respect to one another. The corner frame 142 is configured to receive a corner of the corresponding first electrical component 102 between the arms 160, 162 such that the first arm 162 extends long one side edge 148 of the first electrical component 102 and the second arm 162 extends along a different side edge 148 of the first electrical component 102. In an exemplary embodiment, the first and second arms 160, 162 are connected to one another by the hinge 168. The first and second arms 160, 162 are integrally formed from a common piece of material. For example, the first and second arms 160, 162 may be stamped and formed from a sheet of material. The hinge 168 may extend between the spring fingers 146 and or the bases 174, 176. In the illustrated embodiment, the hinge 168 extends between the spring fingers 146 and not the bases 174, 176. In an alternative embodiment, the first and second arms 160, 162 may be separate from one another and not connected by the hinge 168, but still define a corner frame 142 that receives a corner of the first electrical component 102 therebetween.

The receiving space 144 (shown in FIG. 1) is defined interior of the spring fingers 146. In the exemplary embodiment, the spring fingers 146 are oriented at an acute angle. The spring fingers 146 engage the first electrical component when loaded into the receiving space 144. The spring fingers 146 may be deflected outward when the first electrical component 102 is loaded into the receiving space 144. Such deflection causes the spring fingers 146 to be spring biased against the first electrical component 102. The forces exerted onto the first electrical component 102 by the spring fingers 146 help to locate and or center the first electrical component 102 within the receiving space 144. For example, each spring finger 146 presses against the corresponding side edge 148 of the first electrical component 102 in one direction while another spring finger of another corner frame 142 presses in an opposite direction against the spring bias of the spring finger 146.

The corner frame 142 includes one or more locating post 180 extending from the base 174 and/or 176. The locating post 180 is configured to be received in a corresponding opening in the carrier 120 of the contact assembly 108 to locate the corner frame 142 with respect to the carrier 120 and the array of conductors 122. In an exemplary embodiment, the locating post 180 is integrally formed with the base 174. For example, the locating post 180 may be drawn from the sheet of metal that the corner frame 142 is stamped and formed out of. Alternatively, the locating post 180 may be a separate component that is coupled to a base 174. The locating post 180 may be used to securely couple the corner frame 142 to the contact assembly 108.

The corner frame 142 includes one or more fasteners 182 for securing the corner frame 142 to the carrier 120 of the contact assembly 108. In the illustrated embodiment, the fasteners 182 are formed integral with the bases 174, 176. The fasteners 182 may be drawn or otherwise formed from the bases 174, 176. In the illustrated embodiment, the fasteners 182 are eyelets that may be swaged to the carrier 120 to secure the corner frame 142 to the carrier 120. The fasteners 182 may be secured to the carrier 120 by other means or processes in alternative embodiments. For example, the fasteners 182 may be tabs that are pressed through corresponding slots or openings in the carrier 120 and bent or crimped to the carrier 120. Other types of fasteners may be used to secure the corner frame 142 to the carrier 120. For example, the fasteners may be separate components that are coupled to the corner frame 142, and the carrier 120, such as threaded fastener, latches, clips, and the like.

Figure 5:
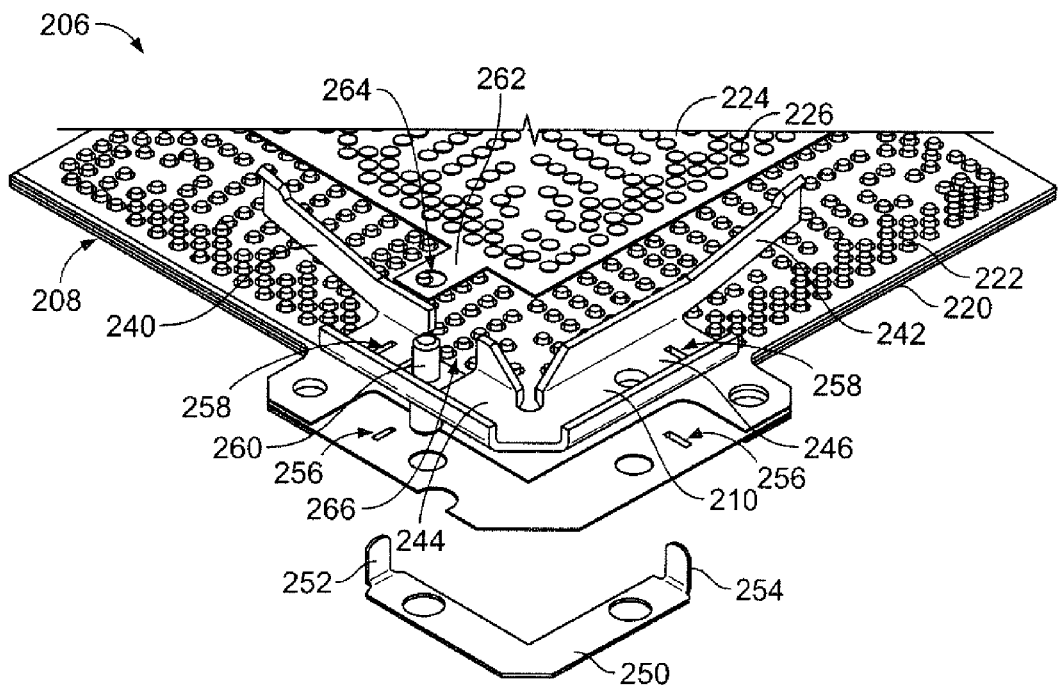
FIG. 5 is a partially exploded view of an interconnect device for the electrical interconnect system formed in accordance with an exemplary embodiment.
Figure 6:
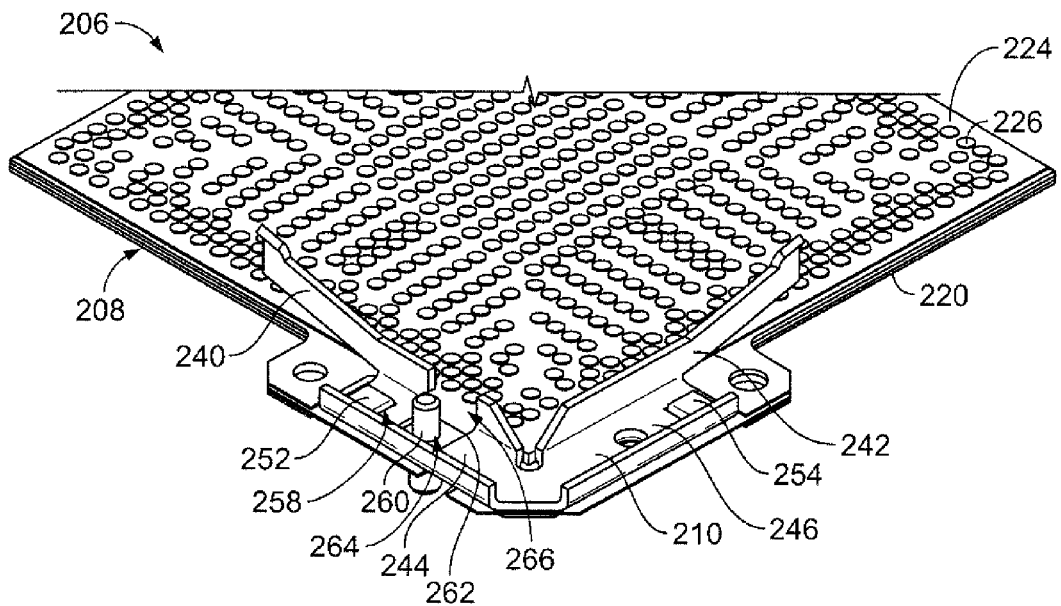
FIG. 6 shows an interconnect device for the electrical interconnect system in an assembled state.

FIG. 5 is a partially exploded view of an alternative interconnect device 206 formed in accordance with an exemplary embodiment. FIG. 6 shows the interconnect device 206 in an assembled state. The interconnect device 206 is similar to the interconnect device 106 (shown in FIG. 1). The interconnect device 206 includes a contact assembly 208 and a corner frame 210 configured to be attached thereto. The contact assembly 208 includes a carrier 220 that holds a plurality of conductors 222, such as elastomeric columns.

A cover 224 is configured to be coupled to the contact assembly 208. The cover 224 includes a plurality of metal caps 226 that are placed over the conductors 222. The caps 226 may be embedded in the cover 224. The caps 226 define an electrical path between the conductors 222 and the electrical component coupled to the interconnect device 206.

Only one corner frame 210 is illustrated in FIG. 5, however, other corner frames may be used, such as attached to the opposite corner or each of the corners of the contact assembly 208. The corner frame 210 includes metal spring fingers 240, 242 that extend along different sides of the contact assembly 208. The spring fingers 240, 242 are configured to engage different side edges of the electrical component coupled to the interconnect device 206. The spring fingers 240, 242 are deflectable. The spring fingers 240, 242 extend generally perpendicular with respect to one another. In an exemplar embodiment, the spring fingers 240, 242 extend from corresponding bases 244, 246. In the illustrated embodiment, the bases 240, 246 are integrally formed with one another and meet at a corner. In alternative embodiments, the bases 244, 246 and corresponding spring fingers 240, 242, may be separate from one another and separately mounted to the contact assembly 208.

A clip 250 is used to secure the bases 244, 246 to the carrier 220. The clip 250 includes tabs 252, 254 that extend through openings 256 in the carrier 220 and openings 258 in the bases 244, 246. As shown in FIG. 6, the tabs 252, 254 are folded over to secure the clip 250 (shown in FIG. 5) to the bases 244, 246. The carrier 220 is captured between the clip 250 and the bases 244, 246.

The corner frame 210 includes a locating post 260 coupled to the base 244. The locating post 260 extends through the carrier 220 to position the corner frame 210 with respect to the contact assembly 208. In an exemplary embodiment, the cover 224 includes an extension 262 with an opening 264 therethrough. The extension 262 is coupled to the locating post 260 by loading the locating post 260 through the opening 264. The cover 224 is located relative to the corner frame 210, and thus the contact assembly 208, by the locating post 260. A window 266 is provided through the spring finger 240 to provide access to the locating post 260 for the extension 262.

FIG. 7 is a side view of an interconnect device 306 formed in accordance with an exemplary embodiment. The interconnect device 306 includes a contact assembly 308 and a plurality of corner frames 310 coupled to the contact assembly 308. The corner frames 310 define a receiving space 312 configured to receive an electrical component therein. The corner frames 310 may be similar to the corner frames 142 and or the corner frames 210 (shown in FIGS. 1 and 5, respectively).

FIG. 8 is partial cross sectional view of the interconnect device 306 showing one of the corner frames 310 mounted to the contact assembly 308. The contact assembly 308 includes a carrier 320 that holds a plurality of conductors 322. In the illustrated embodiment, the carrier 320 is a printed circuit board. The conductors 322 include deflectable spring beams 324 on a first side 326 of the carrier 320 and the conductors 322 include solder balls 328 on a second side 330 of the carrier 320. The conductors 322 include plated vias 332 extending through the carrier 320 between the first and second sides 326, 330. The solder balls 328 are configured to be soldered to corresponding pads 338 of an electrical component 340. The spring beams 324 are configured to engage corresponding pads 334 of an electrical component 336 received in the receiving space 312 (shown in FIG. 7).

The corner frame 310 locates the electrical component 336 within the receiving space 312. The corner frame 310 includes spring fingers 342, 344 that locate the electrical component 336 within the receiving space 312. The spring fingers 342, 344 are configured to engage different side edges of the electrical component 336. Optionally, the spring fingers 342, 344 may be oriented generally perpendicular with respect to one another. The spring fingers 342, 344 are deflectable. The spring fingers 342, 344 are manufactured from a metal material. Optionally, the spring fingers 342, 344 may be stamped and formed with the other structures of the corner frame 310 used to secure the corner frame 310 to the carrier 320.

FIG. 9 is an exploded view of an interconnect device 406 formed in accordance with an exemplary embodiment. The interconnect device 406 is similar to the interconnect device 306 (shown in FIG. 8). The interconnect device 406 includes a contact assembly 408 having one or more corner frames 410 that define a receiving space 412 on a first side 414 of the contact assembly 408 for receiving a first electrical connector 415. The interconnect device 406 includes one or more corner frames 416 on a second side 418 of the contact assembly 406 that defines a receiving space 420 that receives a second electrical component 422.

The contact assembly 408 has a carrier 430, which may be a printed circuit board, and a plurality of conductors 432. The conductors 432 are contacts that extend through the carrier 430. The conductors 432 have spring beams 434 at a first end 436 thereof and spring beams 438 at second ends 440 thereof. The conductors 432 have intermediate sections 442 that extend through vias 444 of the carrier 430. The conductors 432 define electrical paths between the first and second electrical components 415, 422. The corner frames 410, 416 maybe similar to the corner frames 310 (shown in FIG. 8).

It is to be understood that the above description is intended to be illustrated, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An interconnect device comprising:
a contact assembly having a carrier holding an array of conductors, each of the conductors having opposite first and second ends configured to engage corresponding first and second electrical components, the conductors defining conductive paths between the first and second ends to electrically interconnect the first and second electrical components; and
a first corner frame and a second corner frame separate and discrete from the first corner frame, the first and second corner frames being separately mounted to the carrier, the first and second corner frames defining a receiving space therebetween configured to receive the first electrical component therein, each of the first and second corner frames includes a first arm and a second arm, the first and second arms being metal and integrally formed, the first and second arms extending from proximal ends to distal ends, the first and second arms of the first corner frame joined at the proximal ends thereof at a flexible hinge of the first corner frame, the first and second arms of the second corner frame joined at the proximal ends thereof at a flexible hinge of the second corner frame, the first and second arms having metal spring fingers extending to the distal ends of the respective arms and extending along different sides of the receiving space, the spring fingers being configured to engage different side edges of the first electrical component to locate the first electrical component in the receiving space, the spring fingers being deflectable and being configured to be spring biased against corresponding side edges of the first electrical component.

2. The interconnect device of claim 1, wherein the corner frames are mounted directly to the carrier.

3. The interconnect device of claim 1, wherein each spring finger is configured to engage a different side edge of the first electrical component, with the spring fingers of the first corner frame biasing the first electrical component toward the second corner frame and with the spring fingers of the second corner frame biasing the first electrical component toward the first corner frame.

4. The interconnect device of claim 1, wherein the side edges of the first electrical component meet at corners, the corner frames receiving corresponding corners of the first electrical component and extending along both side edges that meet at such corner.

5. The interconnect device of claim 1, wherein the first corner frame and second corner frame are arranged on opposite corners of the first electrical component, the first corner frame engaging first and second side edges of the first electrical component, the second corner frame engaging third and fourth side edges of the first electrical component.

6. The interconnect device of claim 1, wherein the metal spring fingers of each corner frame locate the first electrical component in at least two different directions.

7. The interconnect device of claim 1, wherein the corner frames include locating posts for locating the corner frames with respect to the carrier and the array of conductors.

8. The interconnect device of claim 1, wherein the corner frames include integral fasteners for securing the corner frames to the carrier.

9. An interconnect device comprising:
a contact assembly having a carrier holding an array of conductors, each of the conductors having opposite first and second ends configured to engage corresponding first and second electrical components, the conductors defining conductive paths between the first and second ends to electrically interconnect the first and second electrical components; and
a first corner frame and a second corner frame separate and discrete from the first corner frame, the first and second corner frames being separately mounted to the carrier, the first and second corner frames defining a receiving space therebetween configured to receive the first electrical component therein, each of the first and second corner frames having metal spring fingers meeting at a corner and extending along different sides of the receiving space, the spring fingers being configured to engage different side edges of the first electrical component to locate the first electrical component in the receiving space, the spring fingers being deflectable and being configured to be spring biased against corresponding side edges of the first electrical component, wherein each corner frame includes a clip extending through the carrier and engaging the corresponding corner frame to secure such corner frame to the carrier.

10. The interconnect device of claim 1, wherein the corner frames are stamped and formed from a sheet of metal.

11. The interconnect device of claim 1, wherein each first and second arm includes a base mounted to the carrier, the bases of the corresponding corner frames being oriented generally perpendicular with respect to each other, the metal spring fingers extending from the bases to the distal ends of the respective arms.

12. The interconnect device of claim 1, wherein the metal spring fingers of the first corner member are oriented at an acute angle, and the metal spring fingers of the second corner member are oriented at an acute angle.

13. The interconnect device of claim 11, wherein the flexible hinges allow hinge allow the first and second arms and corresponding bases to flex and to pivot relative to one another.

14. An interconnect device comprising:
a contact assembly having an insulative carrier holding an array of conductive elastomeric columns, each of the elastomeric columns having opposite first and second ends configured to engage corresponding first and second electrical components, the elastomeric columns being internally conductive between the first and second ends to electrically interconnect the first and second electrical components; and
a first corner frame and a second corner frame separate and discrete from the first corner frame, the first and second corner frames being separately mounted to the carrier, the first and second corner frames defining a receiving space therebetween configured to receive the first electrical component therein, each of the first and second corner frames includes a first arm and a second arm, the first and second arms being metal and integrally formed, the first and second arms extending from proximal ends to distal ends, the first and second arms of the first corner frame joined at the proximal ends thereof at a flexible hinge of the first corner frame, the first and second arms of the second corner frame joined at the proximal ends thereof at a flexible hinge of the second corner frame, the first and second arms having metal spring fingers extending to the distal ends of the respective arms and extending along different sides of the receiving space, the spring fingers being configured to engage different side edges of the first electrical component to locate the first electrical component in the receiving space, the spring fingers being deflectable and being configured to be spring biased against corresponding side edges of the first electrical component.

15. The interconnect device of claim 14, wherein the corner frames are mounted directly to the carrier.

16. The interconnect device of claim 14, wherein each spring finger is configured to engage a different side edge of the first electrical component, with the spring fingers of the first corner frame biasing the first electrical component toward the second corner frame and with the spring fingers of the second corner frame biasing the first electrical component toward the first corner frame.

17. The interconnect device of claim 14, wherein the metal spring fingers of each corner frame locate the first electrical component in at least two different directions.

18. The interconnect device of claim 14, wherein the corner frames include locating posts for locating the corner frames with respect to the carrier and the array of conductors.

19. The interconnect device of claim 14, wherein the corner frames are stamped and formed from a sheet of metal.

20. The interconnect device of claim 14, wherein each corner frame includes a clip extending through the carrier and engaging the corresponding corner frame to secure such corner frame to the carrier.

* * * * *